(12) United States Patent
Feltner

(10) Patent No.: US 6,703,852 B1
(45) Date of Patent: Mar. 9, 2004

(54) LOW-TEMPERATURE SEMICONDUCTOR DEVICE TESTING APPARATUS WITH PURGE BOX

(75) Inventor: Thomas A. Feltner, Tracy, CA (US)

(73) Assignee: Xilinx Inc., San Jose, CA (US)

( * ) Notice: Subject to any disclaimer, the term of this patent is extended or adjusted under 35 U.S.C. 154(b) by 0 days.

(21) Appl. No.: 10/323,962

(22) Filed: Dec. 18, 2002

(51) Int. Cl.⁷ .............................................. G01R 31/02
(52) U.S. Cl. .................................... 324/754; 324/158.1
(58) Field of Search .................................. 324/754, 765, 324/158.1, 758, 757, 760

(56) References Cited

U.S. PATENT DOCUMENTS

| | | | | |
|---|---|---|---|---|
| 4,607,220 A | * | 8/1986 | Hollman | 324/760 |
| 5,892,367 A | * | 4/1999 | Magee et al. | 324/760 |
| 6,420,885 B1 | * | 7/2002 | Fredrickson | 324/754 |

* cited by examiner

Primary Examiner—Kamand Cuneo
Assistant Examiner—Jimmy Nguyen
(74) Attorney, Agent, or Firm—Patrick T. Beyer; Edel M. Young; Justin Liu

(57) ABSTRACT

A low-temperature semiconductor device test apparatus that includes a device tester having a purge box mounted thereon, a low-temperature handler system, and a load board having a IC test socket. The purge box is located between the load board and a support plate of the device tester, and between groups of compressible test pins used to pass test signals to the test socket through conductive traces formed in the load board. The purge box includes rigid outer walls defining a chamber that is located opposite to the test sockets. During low-temperature testing, dry air is pumped into the chamber through conduits formed in the walls of the purge box to prevent the condensation of moisture on conductors formed on the load board and exposed in the chamber. In addition, the purge box resists bending of the load board when semiconductor devices are pressed against the test sockets.

11 Claims, 4 Drawing Sheets

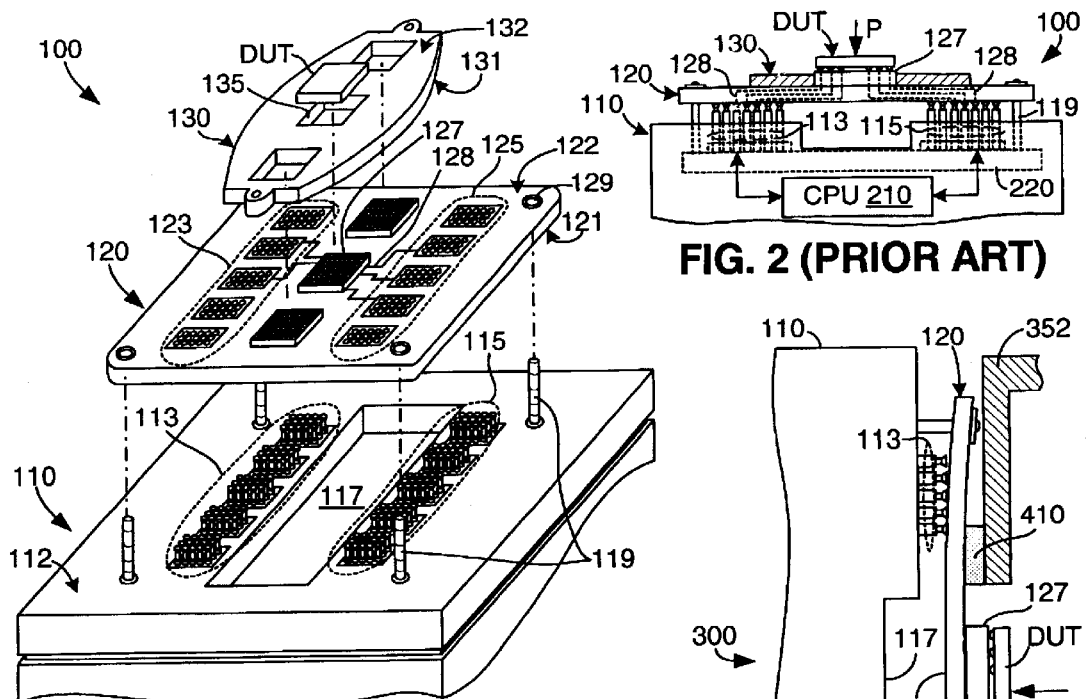
FIG. 1 (PRIOR ART)
FIG. 2 (PRIOR ART)
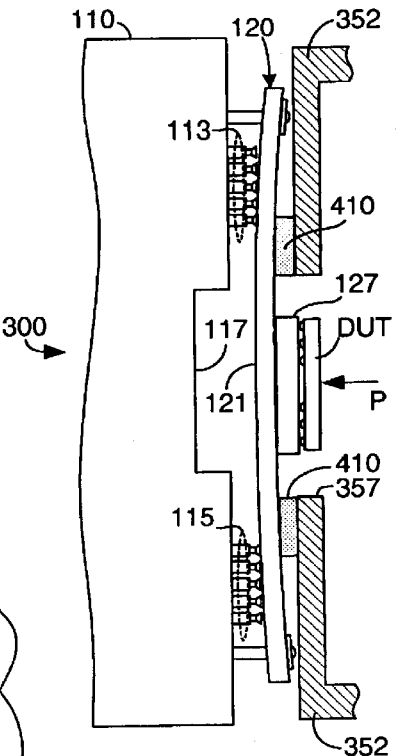
FIG. 4 (PRIOR ART)
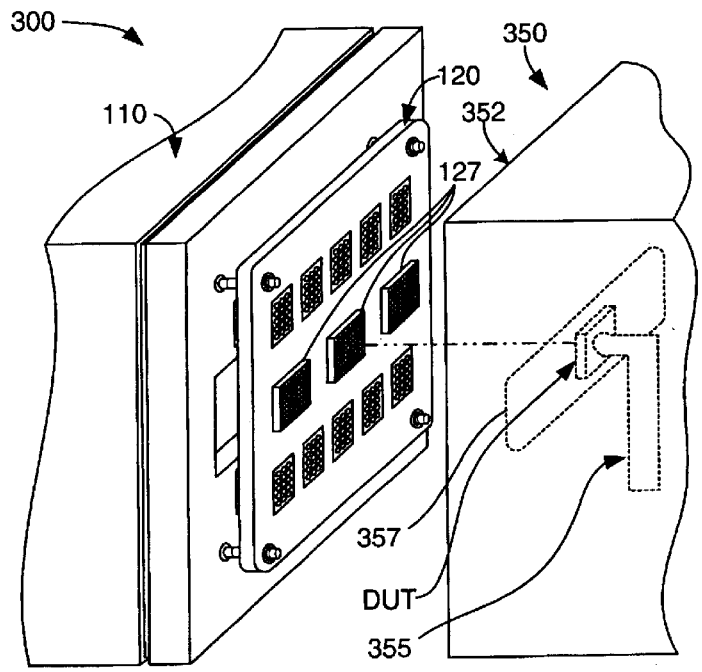
FIG. 3 (PRIOR ART)

US 6,703,852 B1

LOW-TEMPERATURE SEMICONDUCTOR DEVICE TESTING APPARATUS WITH PURGE BOX

FIELD OF THE INVENTION

The present invention relates to integrated circuit semiconductor device test systems, more particularly to a tester and handler interface apparatus associated with semiconductor device testing.

BACKGROUND OF THE INVENTION

FIG. 1 is an exploded perspective view showing a conventional ATE system 100, which represents a typical system utilized to test packaged integrated circuits (ICs) prior to sale to an end user. Conventional ATE system 100 includes an IC test signal generator (device tester) 110 (partially shown), a load board 120, a docking plate 130, and an automated handler (not shown) for mounting IC DUTs onto load board 120. Briefly described, the handler associated with ATE system 100 moves an IC DUT from a shipping tray (not shown) onto a test socket 127 that is mounted on load board 120. Alternatively, this process may be done by hand (i.e., manually). Testing is then carried out by transmitting electrical signals from device tester 110 to an IC DUT through test socket 127, and processing test data returned from the IC DUT in response to the applied test signals. This testing process is typically used to identify non-functional ICs.

Referring to the lower portion of FIG. 1, device tester 110 is an expensive piece of computing equipment that includes a base unit (partially shown) having a test surface 112 located at one end. Extending from test surface 112 are a first group 113 of compressible test ("pogo") pins arranged in a first column, and a second group 115 of compressible test pins arranged in a second column that is parallel to the first column such that a central channel 117 is defined between first and second groups 113 and 115. Also extending from test surface 112 are several connection bolts 119 that are used to secure load board 120 to device tester 110. An example of conventional device testers that are consistent with device tester 110 is the Integra J750 Test Family, which is produced by Teradyne, Inc. of Boston Mass., USA.

Located above device tester 110 is load board 120, which is a printed circuit board (PCB) having a lower surface 121 facing test surface 112 and an upper surface 122 facing away from test surface 112, and includes a first plurality of test contacts 123, a second plurality of test contacts 125, and one or more test sockets 127. First test contacts 123 are arranged in a first column, and each test contact includes a contact pad located on lower surface 121 such that each contact pad abuts the tip of a corresponding compressible pin of first group 113 when load board 120 is mounted onto device tester 110. Similarly, contact pads of second test contacts 125 are arranged on lower surface 121 in a second column such that each test contact abuts the tip of a corresponding compressible pin of second group 115. Test sockets 127 are mounted on upper surface 122, and include pins or other contact structures that are connected to corresponding first and second test contacts 123 and 125 by conductive traces (wires) 128, which are formed in accordance with known practices. Finally, load board 120 is secured to device tester 110 using connectors 129 that receive the ends of bolts 119 and hold load board 120 such that the compressible pins of first group 113 are firmly pressed against the contact pads of first test contacts 123, and such that the compressible pins of second group 115 are firmly pressed against the contact pads of second test contacts 125.

Shown above load board 120 is docking plate 130, which is a rigid (e.g., aluminum) structure that is fixed (e.g., screwed) to upper surface 122 of load board 120, and includes openings 135 that mount over test sockets 127.

FIG. 2 is a cross-sectional side view showing conventional ATE system 100 with docking plate 130 mounted on load board 120, and load board 120 fastened to device tester 110. Note that compressible test pins of each group 113 and 115 are electrically connected to the DUT via corresponding conductive traces 128, and receive test signals from a central processing unit (CPU) 210. As indicated in the lower portion of FIG. 2, compressible pin groups 113 and 115 are mounted on a support plate 220 that has sufficient strength to resist the downward force from the compressible pins of groups 113 and 115 when load board is fastened onto the ends of bolts 119.

As indicated at the top of FIG. 2, during testing, docking plate 130 functions to prevent bending of load board 120, which is subjected to a downward force P that is needed to press a DUT against test socket 127. Downward force P is used to provide the necessary connection between the contact structures of test socket 127 and contact structures (e.g., solder balls or bumps) formed on a lower surface of the DUT. When the DUT has a large number of such contact structures, the force P can be significant in order to assure that all of the contact structures achieve a suitable connection with corresponding contact structures of test socket 127. By providing a rigid docking plate 130 in the vicinity of test sockets 127, bending of load board 120 by this large force P is resisted, thereby maintaining suitable connections between the compressible pins and the corresponding contact pads formed on load board 120.

Low-temperature semiconductor device testing is often used to verify the conformance of a semiconductor device with military specifications. During low-temperature testing, semiconductor devices are placed in a special low-temperature box containing a cool dry environment maintained at a temperature in the range of, e.g., 0° C. to −58° C., and a handler that moves the cooled semiconductor devices between a loading tray and a test socket that is coupled to a device tester.

FIGS. 3 and 4 are an exploded perspective view and a simplified cross-sectional side view showing a portion of a conventional low-temperature testing arrangement 300 that utilizes test system 100 (described above). The conventional low-temperature testing arrangement 300 generally includes device tester 110, a low-temperature handler system 350, and load board 120, which connect between device tester 110 and handler system 350 during low-temperature testing procedures. Low-temperature handler system 350 includes an insulated box 352 connected to a cooling system (not shown), and a device handling mechanism (handler) 355 mounted inside of insulated box 352. An opening 357 is provided in a side wall of insulated box 352 through which test sockets 127 of handler board 120 are exposed to the cool dry environment maintained inside insulated box 352. As indicated in FIG. 4, a rubber gasket 410 or other isolation structure is utilized to provide a seal around opening 357 when load board 120 is pressed against insulated box 352. Device handling mechanism 355 (partially shown) is an expensive precise robot including an arm for moving a DUT from a storage location (e.g., a shipping tray) to the test socket 127 during test procedures. The storage location is also inside of insulated box 352 so that the DUTs are maintained at a desired low temperature throughout the test procedures. Conventional systems meeting the description of low-temperature handler system 350 are produced, for example, by Delta Design of San Diego, Calif., USA.

A first problem associated with conventional low-temperature testing arrangement 300 is that, during low temperature testing, the low temperature of the DUT can cause condensation to form on the back surface 121 of load board 120. The potential for condensation is particularly high on the back surface 121 of load board 120 opposite test sockets 127 because of the cold temperatures conducted along contact structures 128 (see FIG. 2) from the cooled DUT. This condensation can cause a short circuit between any traces 128 or related contact structures that are exposed on back surface 121, thereby producing erroneous test signals.

One conventional structure that addresses the problem of condensation during low-temperature device testing is taught by Fredrickson in co-owned U.S. Pat. No. 6,420,885, and includes a dry air chamber formed on a bracket that supports a handler (load) board. However, while this bracket-based structure is suitable for certain device testers, it cannot be integrated into newer test systems such as those disclosed above.

Another problem associated with conventional low-temperature testing arrangement 300 is that docking plate 130 (shown in FIGS. 1 and 2) must often be removed in order to integrate conventional tester 110 with conventional insulated box 352. In particular, conventional insulated boxes, such as insulated box 352, are often formed with an opening 355 that is too small to accommodate docking plate 130. Consequently, as indicated in FIGS. 3 and 4, low-temperature testing arrangement 300 must be utilized with the docking plate removed. As indicated in FIG. 4, when a DUT is pressed against test socket 127 when the docking plate is removed, the resulting force P can cause load board 120 to bend inward, which can result in damage to the compressible test pins of groups 113 and 115, or can cause faulty connection between the compressible test pins and corresponding contact pads formed on surface 121 of load board 120.

What is needed is a structure for the low-temperature testing arrangements described above that avoids condensation during low temperature testing, and also avoids load board bending during device testing when a docking plate can not be used.

SUMMARY OF THE INVENTION

The present invention is directed to a device tester and load board assembly for a low-temperature IC test system that includes a purge box mounted on the device tester below the load board. In particular, the purge box is located between two groups of compressible test ("pogo") pins extending between the device tester and load board such that walls of the purge box form a chamber with the back surface of the handler board at a location opposite to a test socket mounted on a front surface of the handler board. According to a first aspect of the present invention, the walls of the purge box are formed from a rigid material that resists bending of the handler board during testing, thereby obviating the need for a docking plate. According to a second aspect, during low-temperature testing, a dry gas is pumped into the chamber, thereby avoiding the formation of condensation or frost on the back surface of the handler board.

BRIEF DESCRIPTION OF THE DRAWINGS

These and other features, aspects and advantages of the present invention will become better understood with regard to the following description, appended claims, and accompanying drawings, where:

FIG. 1 is an exploded perspective view showing a portion of a conventional ATE system;

FIG. 2 is a side cross-sectional view showing the conventional ATE system of FIG. 1;

FIG. 3 is an exploded perspective view showing a low-temperature test assembly including a handler interface apparatus and the conventional ATE system of FIG. 1;

FIG. 4 is a side cross-sectional view showing a portion of the low-temperature test assembly of FIG. 3;

DETAILED DESCRIPTION OF THE DRAWINGS

Figure 5:
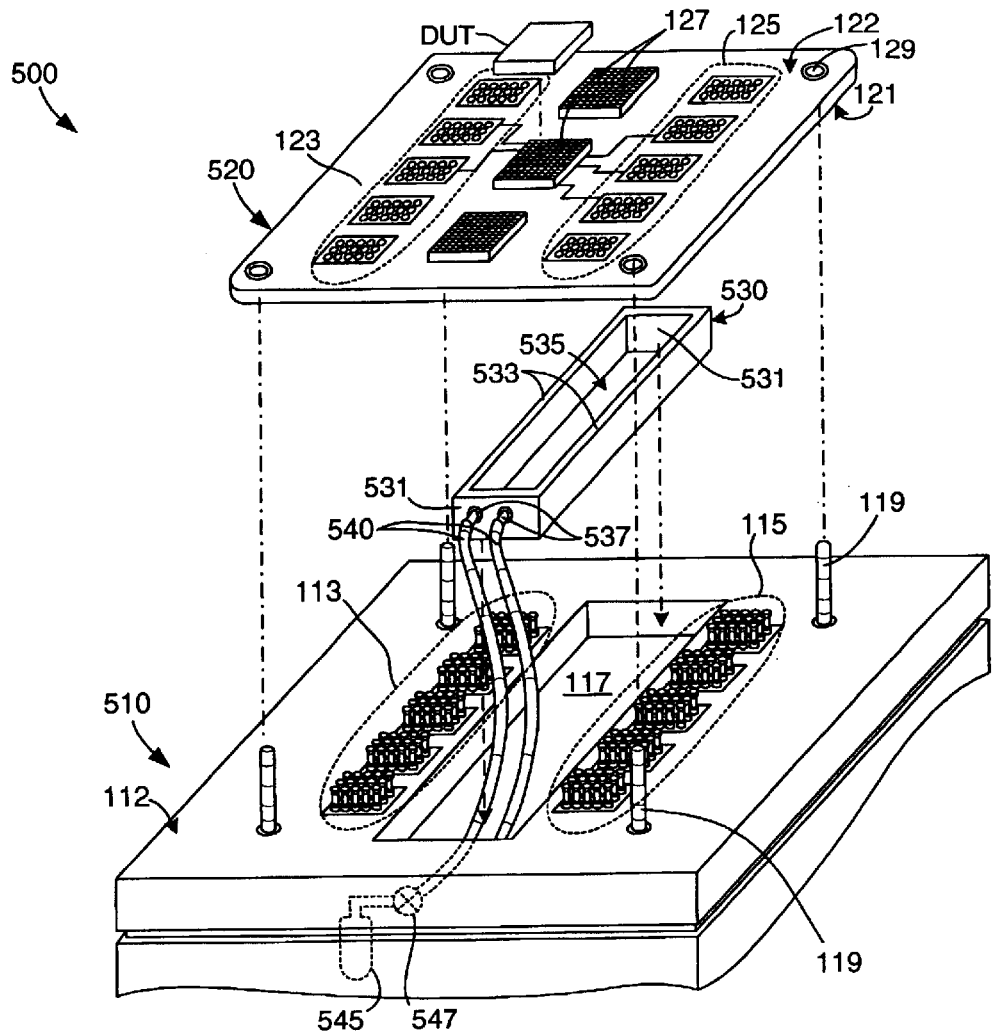
FIG. 5 is an exploded perspective view showing a portion of a simplified ATE system that is modified to include a purge box according to the present invention.
Figure 6:
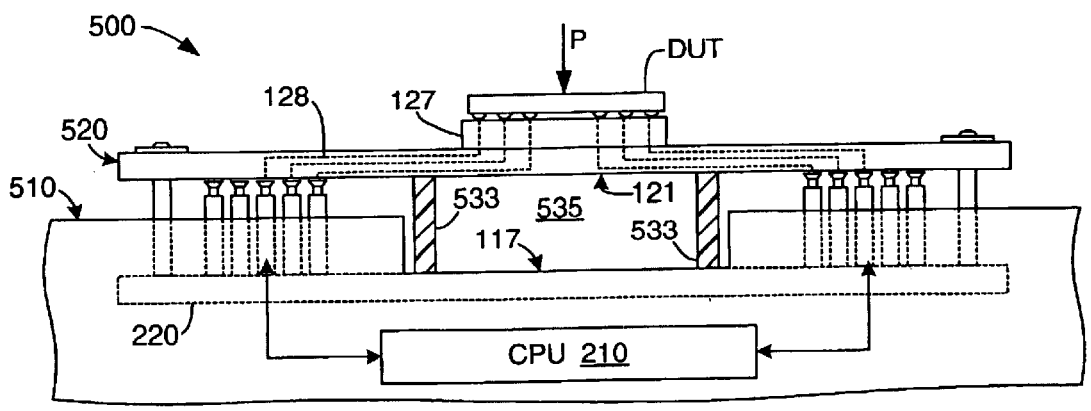
FIG. 6 is a side cross-sectional view showing a portion of the simplified ATE system of FIG. 5.

FIGS. 5 and 6 are an exploded perspective view and a simplified cross-sectional side view showing an ATE system 500 for testing IC devices according to a first embodiment of the present invention. Similar to conventional system 100 (discussed above), ATE system 500 includes an IC device tester (base) 510 (partially shown), a load board 520, and a conventional automated handler (not shown) for mounting IC DUTs onto load board 520. Aside from the modifications described below, device tester 510 and load board 520 operate as described above with reference to device tester 110 and load board 120 of conventional system 100. Accordingly, structures of device tester 510 and load board 520 that are essentially identical to those of conventional device tester 110 and conventional load board 120 are identified with similar reference numbers, and detailed description of these structures is omitted below for brevity.

In accordance with the present invention, device tester 510 is modified to include a purge box 530 that is mounted on test surface 112 in channel region 117 (i.e., between first test pin group 113 and second test pin group 115), and is coupled by one or more hoses 540 to a source of dry gas. In the illustrated embodiment, purge box 530 is a rectangular structure including end walls 531 and side walls 533 that form a frame surrounding a central chamber 535. As discussed below with reference to a specific embodiment, a bottom wall may be included to cover a lower end of purge box 530, but the upper end of purge box 530 is open for reasons that will become clear below.

As indicated in FIG. 6, according to a first aspect of the present invention, walls 531 and 533 of purge box 530 are constructed to prevent bending of load board 520 during test operations, thereby obviating the need for docking plate 130 of conventional system 100. As discussed above with reference to FIGS. 2 and 4, docking plate 130 is mounted on conventional load board 120 to prevent bending during test operations, but cannot be used in some low-temperature testing situations. To address this problem, walls 531 and 533 of purge box 530 are formed from a rigid, preferably non-conducting material (e.g., G-11), and have a thickness that provides sufficient strength to resist the downward bending of load board 520 during all types of DUT testing operations, thereby obviating the need for a docking plate. That is, by positioning purge box 530 under load board 520 such that the upper edges of walls 531 and 533 abut lower surface 121 during testing, the downward bending of load board 520 due to force P applied during testing is resisted, thereby avoiding damage and/or disconnection of the test pins of groups 113 and 115. Moreover, because purge box 530 is attached to device tester 510 (as opposed to load board 520), purge box 530 can remain in place during all types of testing, thereby being transparent to an end user of ATE system 500.

According to a second aspect of the present invention, walls 531 and 535 cooperate with load board 520 and support plate 220 to form chamber 535, which is used to provide a dry gas environment on lower surface 121 of load board 520 opposite to test sockets 127. As indicated in FIG. 5, one or more nozzles 537 are formed in, for example, end wall 531 to facilitate the selective passage of dry gas (e.g., dry air) into central chamber 535 from a source (e.g., gas canister) 545 via a control valve 547. As indicated in FIG. 6, when load board 520 is mounted onto device tester 510, load board 520 forms an upper wall that encloses chamber 535. Subsequently, when dry gas from source 545 is pumped into chamber 535, the dry gas prevents condensation from forming on back surface 121 opposite test sockets 127, thereby preventing short-circuit conditions that can lead to erroneous test data.

Figure 7:
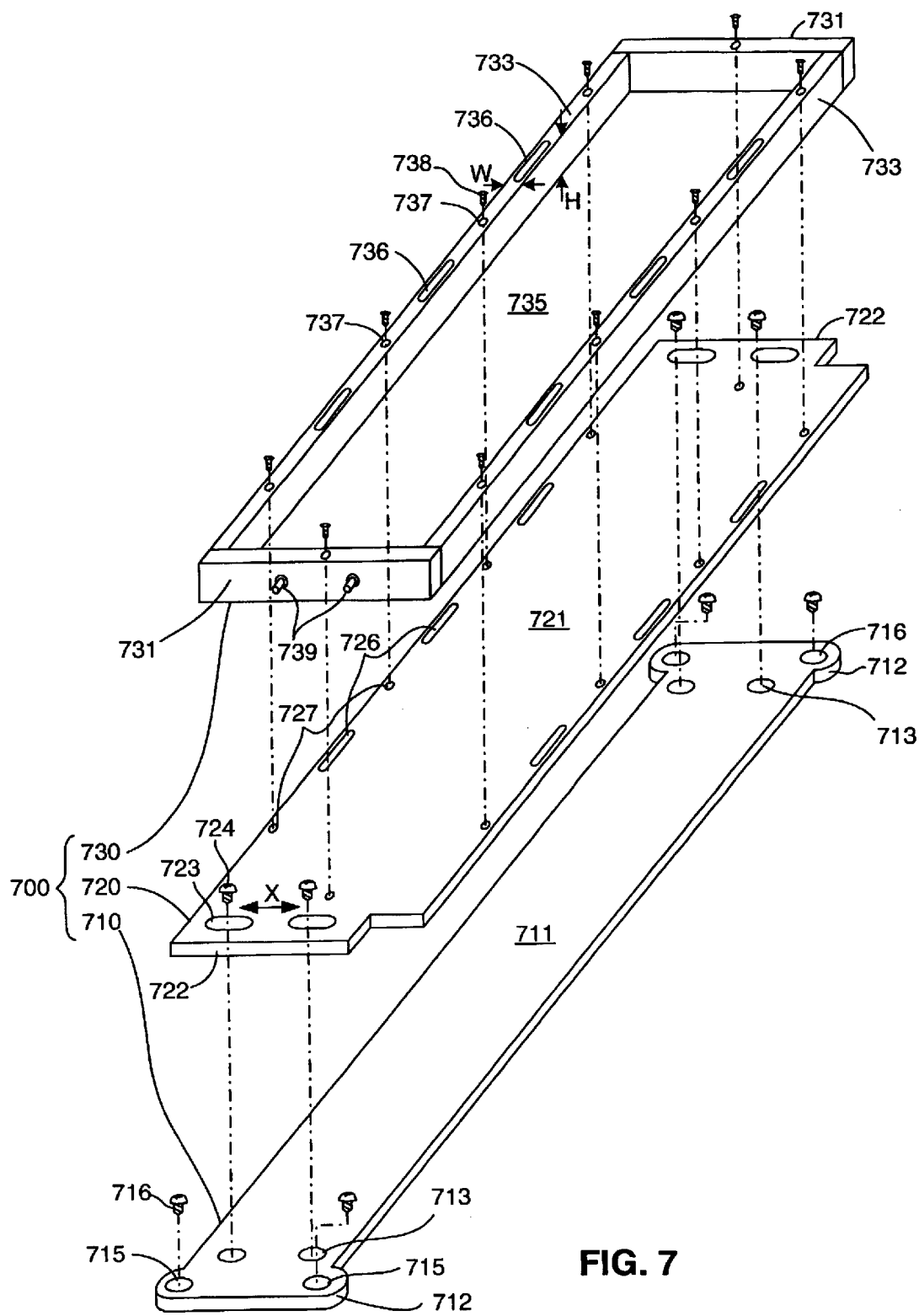
FIG. 7 is an exploded perspective view showing a purge box according to a specific embodiment of the present invention.

FIG. 7 is an exploded perspective view showing a purge box 700 according to a specific embodiment of the present invention. Purge box 700 includes a mount plate 710, a base plate 720, and an upper frame 730. Mount plate 710 (e.g., 0.25 inch aluminum plate) includes an elongated central region 711 and opposing ends 712 that define threaded (first) holes 713 and through (second) holes 715. When assembled onto the support plate of a device tester unit, holes 715 are mounted over corresponding holes provided in the support plate, and then mount plate 710 is secured to the support plate using fasteners (e.g., screws) 716. Base plate 720 (e.g., 0.25 inch aluminum plate) includes an elongated central region 721 and opposing ends 722 that define slots 723 and second holes 715. In addition, slots 726 and threaded (third) holes 727 are defined along edges of base plate 720. Base plate 720 is mounted on mount plate 710 by aligning slots 723 with threaded holes 713, and then inserting fasteners (e.g., screws) 724 through slots 723. Slots 723 facilitate adjustment of base plate 720 relative to mount plate 710 in a lateral (X) direction. Frame 730 includes end walls 731 and side walls 733 formed from a suitable rigid, electrically insulating material having widths and heights selected to define a central chamber 735. In one embodiment, end walls 731 and side walls 733 are formed using G-11 having a width W of 0.25 to 0.5 inches, and a height H of 0.5 inches. G-11, which is a thermosetting industrial laminate consisting of a continuous filament glass cloth material with a high temperature epoxy resin binder, is selected to minimize chaffing with load board 520. Walls 731 and 733 are mounted onto base plate 720 by passing fasteners 738 through holes 737 and connecting their respective tips to corresponding threaded holes 727. Note that slots 736 and slots 737 are aligned when walls 731 and 733 are properly mounted to accommodate screws protruding from load board 520, and may be omitted if such screws are not present. Finally, nozzles 739 are provided on an end wall 711 to facilitate the passage of gas through horizontal openings into and out of chamber 735 in the manner described above.

Figure 8:
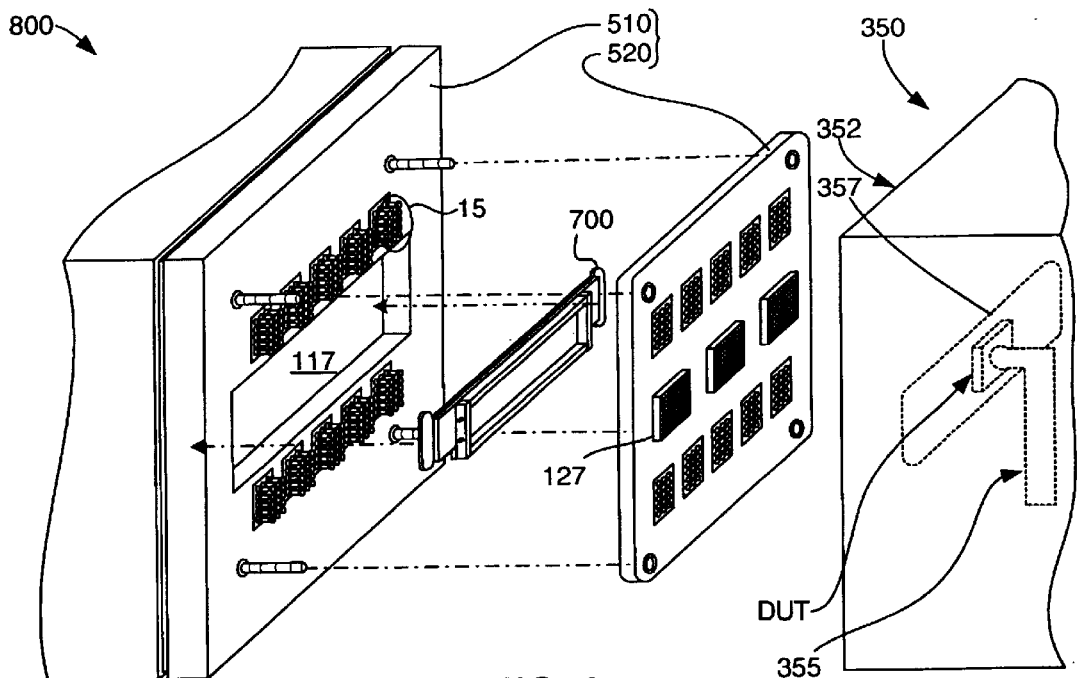
FIG. 8 is an exploded perspective view showing a low-temperature test assembly including a handler interface apparatus and an ATE system including the purge box of FIG. 7.
Figure 9:
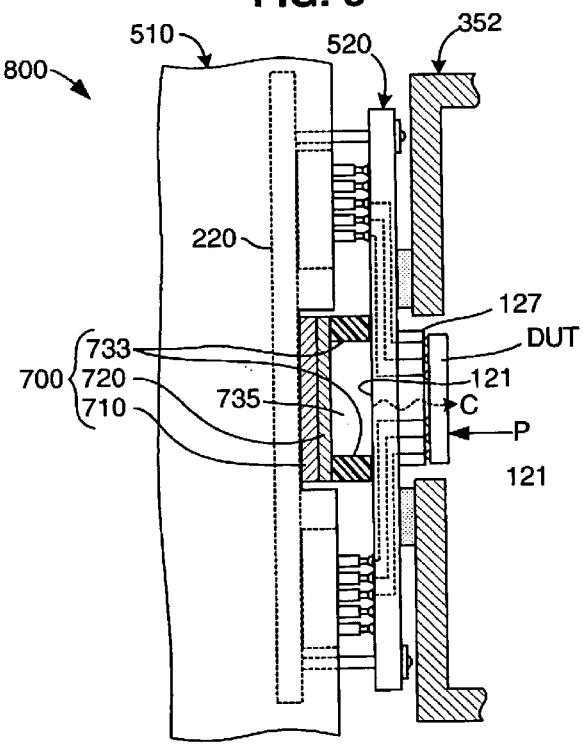
FIG. 9 is a side cross-sectional view showing a portion of the low-temperature test assembly of FIG. 8.

FIGS. 8 and 9 are an exploded perspective view and a simplified cross-sectional side view showing a portion of a low-temperature testing arrangement 800 that utilizes test system 500 (described above) and purge box 700 according to another embodiment of the present invention. Low-temperature testing arrangement 800 generally includes device tester 510, conventional low-temperature handler system 350 (described above), and load board 520, which connected between device tester 510 and handler system 350 during low-temperature testing procedures. As described above, low-temperature handler system 350 includes an insulated box 352 connected to a cooling system, and a device handling mechanism 355 mounted inside of insulated box 352. An opening 357 is provided in a wall of insulated box 352 through which test sockets 127 of load board 520 are exposed to the cool dry environment maintained inside insulated box 352. As indicated in FIG. 9, purge box 700 is mounted in region 117 on support plate 220 of device tester 510, and forms a chamber 735 with load board 520 that receives dry air during low-temperature testing. In particular, as indicated in FIG. 9, when a chilled DUT is pressed against test socket 127, heat is drawn from test socket 127 and the abutting region of load board 520 (as indicated by arrow C), thereby causing surface 121 opposite test socket 127 to become cold. By pumping dry gas into chamber 735 in the manner described above, the formation of condensation on surface 121 is prevented, thereby preventing short-circuit conditions that can lead to erroneous test data.

Although the present invention has been described with respect to certain specific embodiments, it will be clear to those skilled in the art that the inventive features of the present invention are applicable to other embodiments as well. These are intended to fall within the scope of the present invention.

I claim:

1. A tester system for semiconductor device testing comprising:
    a base having a test surface and including a first group of compressible test pins and a second group of compressible test pins extending from the test surface, each compressible test pin of the first and second groups having tips;
    a load board mounted over the base and including a first and second pluralities of test pin contacts formed on a first surface facing the base, and a device test socket mounted on a second surface facing away from the base, wherein the first plurality of test pin contacts abut the tips of the first group of compressible test pins, the second plurality of test pin contacts abut the tips of the second group of compressible test pins, and the device test socket is located between the first and second groups of test pin contacts; and
    a purge box connected directly to the base between the first and second groups of compressible test pins, the purge box including walls that extend toward the first surface of the load board and define a chamber that is located opposite to the device test socket.

2. The tester system according to claim 1, wherein the purge box comprises a nozzle communicating with a hole formed in one of said walls of the purge box.

3. The tester system according to claim 2, further comprising means for pumping dry gas into the chamber through the nozzle.

4. A tester system for semiconductor device testing comprising:
    a base having a support plate and including a first group of compressible test pins and a second group of compressible test pins extending from the support plate, each compressible test pin of the first and second groups having tips;

a load board mounted over the base and including a first and second pluralities of test pin contacts formed on a first surface facing the base, and a device test socket mounted on a second surface facing away from the base, wherein the first plurality of test pin contacts abut the tips of the first group of compressible test pins, the second plurality of test pin contacts abut the tips of the second group of compressible test pins, and the device test socket is located between the first and second groups of test pin contacts; and a purge box including:
  a mounting plate connected directly to the support plate of the base;
  a base plate mounted on the mounting plate; and
  a frame mounted on the base plate and including a plurality of walls that extend toward the first surface of the load board at a point opposite to the device test socket such that a chamber is defined by the base plate, the walls, and the first surface of the load board.

5. The tester system according to claim 4, wherein the frame comprises a plurality of walls formed from G-11.

6. The tester system according to claim 5, wherein the purge box comprises a nozzle communicating with a hole formed in one of said walls of the purge box.

7. The tester system according to claim 6, further comprising means for pumping dry gas into the chamber through the nozzle.

8. A low-temperature semiconductor device testing system comprising:

a low-temperature handler system including an insulated box defining an opening, and a device handler mechanism mounted in the insulated box;

a device tester mounted adjacent to the low-temperature handler system, the device tester including a support plate, a first group of compressible test pins mounted on the support plate, and a second group of compressible test pins mounted on the support plate such that a channel is formed between the first and second groups, wherein each compressible test pin of the first and second groups includes a tip extending toward the low-temperature handler system; and a load board mounted on the device tester and including a first and second pluralities of test pin contacts formed on a first surface facing the base, and a device test socket mounted on a second surface facing away from the base and into the opening defined by the low-temperature handler system, wherein the first plurality of test pin contacts abut the tips of the first group of compressible test pins, the second plurality of test pin contacts abut the tips of the second group of compressible test pins, and the device test socket is located between the first and second groups of test pin contacts;

wherein the device tester further comprises a purge box mounted in the channel between the first and second groups of compressible test pins, the purge box including:
  a mounting plate connected directly to the support plate of the device tester;
  a base plate mounted on the mounting plate; and
  a frame mounted on the base plate and including a plurality of walls that extend toward the first surface of the load board at a point opposite to the device test socket such that a chamber is defined by the base plate, the walls, and the first surface of the load board.

9. The low-temperature semiconductor device testing system according to claim 8, wherein the plurality of walls of the purge box comprise G-11.

10. The low-temperature semiconductor device testing system according to claim 8, wherein the purge box comprises a nozzle mounted on an outer surface of one of said walls, said nozzle communicating with a hole passing through said wall to said chamber.

11. The low-temperature semiconductor device testing system according to claim 10, wherein the device tester further comprises means for pumping dry gas into the chamber through the nozzle.

* * * * *